(12) United States Patent
Wolfe et al.

(10) Patent No.: US 7,504,619 B2
(45) Date of Patent: Mar. 17, 2009

(54) ENERGETIC NEUTRAL PARTICLE LITHOGRAPHIC APPARATUS AND PROCESS

(75) Inventors: John C. Wolfe, Houston, TX (US); Paul Ruchhoeft, Houston, TX (US)

(73) Assignee: The University of Houston System, Houston, TX (US)

( * ) Notice: Subject to any disclaimer, the term of this patent is extended or adjusted under 35 U.S.C. 154(b) by 275 days.

(21) Appl. No.: 10/515,041

(22) PCT Filed: May 19, 2003

(86) PCT No.: PCT/US03/15936

§ 371 (c)(1),
(2), (4) Date: Oct. 11, 2005

(87) PCT Pub. No.: WO03/100816

PCT Pub. Date: Dec. 4, 2003

(65) Prior Publication Data

US 2006/0124865 A1 Jun. 15, 2006

(51) Int. Cl.
*H01S 1/00* (2006.01)
(52) U.S. Cl. .................................. 250/251; 250/492.21
(58) Field of Classification Search ................. 250/251, 250/492.21
See application file for complete search history.

(56) References Cited

U.S. PATENT DOCUMENTS

| | | | | | |
|---|---|---|---|---|---|
| 5,352,899 | A | * | 10/1994 | Golovanivsky et al. | 250/492.21 |
| 5,469,489 | A | * | 11/1995 | Miyake et al. | 378/35 |
| 5,733,688 | A | * | 3/1998 | Kato et al. | 430/5 |
| 5,834,769 | A | * | 11/1998 | Fujita et al. | 250/251 |
| 5,851,725 | A | * | 12/1998 | McClelland | 430/269 |
| 5,882,826 | A | * | 3/1999 | Kato et al. | 430/5 |
| 6,087,659 | A | * | 7/2000 | Adler et al. | 250/310 |
| 6,183,817 | B1 | * | 2/2001 | Gersonde | 427/561 |
| 6,462,333 | B1 | * | 10/2002 | Gersonde | 250/251 |
| 6,548,124 | B1 | * | 4/2003 | Brumer et al. | 427/586 |
| 6,610,986 | B2 | * | 8/2003 | Hartley | 250/423 R |
| 6,787,759 | B1 | * | 9/2004 | Saffman | 250/251 |
| 6,891,152 | B2 | * | 5/2005 | Averbukh | 250/251 |
| 6,891,623 | B1 | * | 5/2005 | Baudon et al. | 356/491 |
| 6,972,420 | B2 | * | 12/2005 | Silverman | 250/492.2 |
| 7,002,141 | B2 | * | 2/2006 | Ohmukai et al. | 250/251 |
| 7,030,397 | B2 | * | 4/2006 | Mezei et al. | 250/505.1 |
| 7,038,217 | B2 | * | 5/2006 | Yamada et al. | 250/424 |
| 7,085,616 | B2 | * | 8/2006 | Chin et al. | 700/121 |
| 7,141,783 | B2 | * | 11/2006 | Kim et al. | 250/251 |
| 7,205,534 | B2 | * | 4/2007 | Migeon et al. | 250/251 |

\* cited by examiner

*Primary Examiner*—David A. Vanore
(74) *Attorney, Agent, or Firm*—Robert W. Strozier

(57) ABSTRACT

An energetic neutral particle lithographic apparatus is disclosed for replicating sub-micron and nanoscale patterns including a source producing a beam of energetic neutral particles, comprising atoms or molecules, by charge transfer scattering of energetic ions from the molecules of a gas, a mask member having open stencil windows in a supporting membrane, an energetic neutral particle protective layer on the membrane, and a reproduction member consisting of an energetic neutral particle-sensitive layer between a substrate and the mask for absorbing energetic neutral particles in a pattern created by the mask.

26 Claims, 15 Drawing Sheets

ENERGETIC NEUTRAL PARTICLE LITHOGRAPHIC APPARATUS AND PROCESS

BACKGROUND OF THE INVENTION

1. Field of the Invention

The present invention relates to an energetic neutral particle lithographic apparatus and technique for replicating patterns with submicron linewidths, where the spacing between the mask and substrate is greater than 1000 times the minimum linewidth.

More particularly, the present invention relates to an energetic neutral particle lithographic apparatus and technique for replicating patterns with submicron linewidths, where the apparatus includes generating a beam of small energetic atoms or molecules, contacting a substrate including a beam sensitive coating and a mask with the beam, where a spacing between the mask and the substrate is greater than 1000 times the minimum linewidth, and developing the coating to produce a patterned substrate.

2. Description of the Related Art

Proximity lithography is a method of pattern reproduction in which energetic radiation, x-rays, electrons or ions, irradiate a mask containing a pattern of opaque and transmissive regions. The radiation pattern consisting of the radiation that passes through the transmissive regions exposes a sensitive film on a substrate positioned in close proximity to, but not touching, the mask. After exposure, the film is subjected to a developer that removes either the exposed or the unexposed regions thereby producing either a positive or negative copy of the mask pattern. X-ray proximity lithography technology has been developed for manufacturing integrated circuits with feature sizes down to about 50 nm while, because of their shorter wavelength and hence weaker diffraction, electrons and ions have been explored for printing sub-50 nm features.

Unlike x-rays, however, these charged particles are easily deflected by fixed and mobile charge in the mask and on the substrate. This leads to blurring and imprecise pattern placement in the printed image that limits the utility of electrons or ions for high resolution printing. This problem is particularly difficult if the features are extremely small and/or the spacing between the mask and wafer is large, particularly with spacing between the mask and substrate is more than 1000 times the minimum feature size in the mask.

Thus, there is a need in the art for a lithographic apparatus and process capable of making submicron devices, especially devices having a size of 50 nm or less, 20 nm or less, 10 nm or less.

SUMMARY OF THE INVENTION

The present invention provides an improved pattern replication technique that provides submicron and preferably 100 nm or less resolution and especially 50 nm or less, depending on the application and size of the elements to be formed on the substrate.

The present invention also provides a technique, where the presence of electrostatic charges on or in the mask or on or in the wafer or substrate has little or no detrimental effect on the resolution or accuracy of the replicated pattern.

The present invention also provides a technique which is inexpensive, simple, highly accurate and reliable.

The present invention provides an energetic neutral particle lithographic apparatus capable of replicating submicron patterns, preferably patterns of 100 nm or less, particularly, 50 nm or less and, especially, 20 nm or less. Of course, the preferred size will depend on the desired pattern and on its final use. The apparatus includes an energetic neutral particle source adapted to produce a beam of energetic neutral atoms and/or molecules by charge exchange scattering between energetic ions and a gas, a mask member having an energetic particle absorbing layer and transmissive stencil windows that produce an energetic neutral particle image of the pattern on the mask, and a reproduction member having an energetic particle sensitive film supported on a substrate. The sensitive film is disposed between the substrate and the mask for absorbing energetic atoms or molecules in accordance with the pattern generated by the mask.

The present invention also provides a method for making and using the apparatuses and techniques.

DESCRIPTION OF THE DRAWINGS

The invention can be better understood with reference to the following detailed description together with the appended illustrative drawings in which like elements are numbered the same.

DETAILED DESCRIPTION OF THE INVENTION

Figure 1:
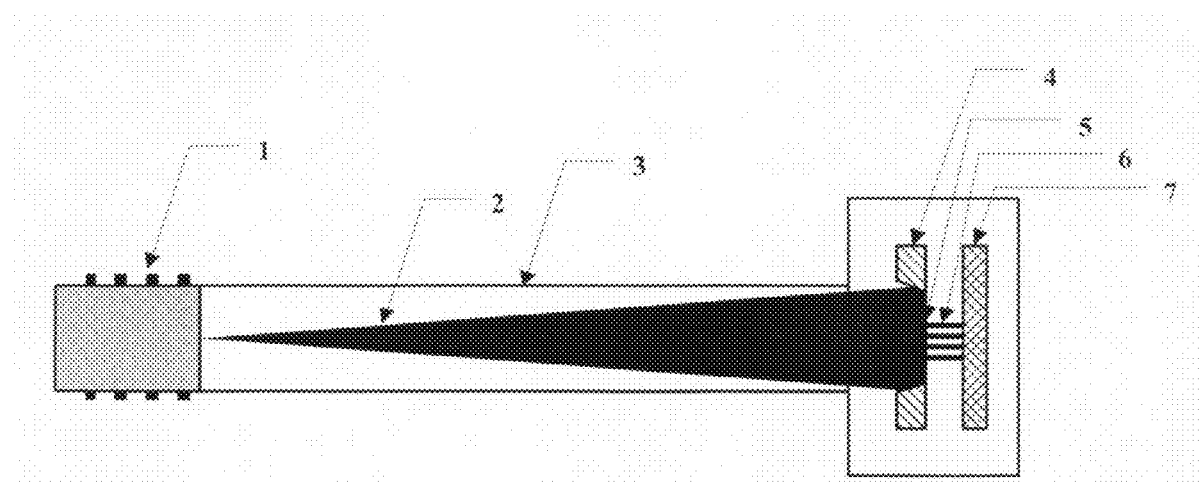
FIG. 1 depicts a diagram of the energetic neutral particle lithographic device according to the invention.

The inventors have found that an apparatus can be constructed and a method based thereon can be practiced that allows pattern replication with reduced to eliminated linewidth blurring due to electrostatic interference between a charged exposing beam and localized electrostatic charges generated in or on the patterning mask or in or on the beam sensitive material or in or on the substrate to be patterned. The apparatus and method have as a key feature the production and use of energetic neutral atom or molecular beams.

The present invention broadly relates to an apparatus including a source of an energetic neutral atom and/or molecular beam and a patterning assembly, where the assembly includes a substrate, a beam sensitive film and a mask. The mask includes beam opaque and beam transparent regions, zones or areas, where the transparent areas are often referred to as windows or stencil window. The beam sensitive film is disposed on the surface of the substrate. When the mask and substrate are exposed to the beam, a pattern in produced in the sensitive film due to the interaction of the film material with the neutral particle beam constituents. The resulting pattern can either be a positive pattern of the mask windows or a negative pattern of the mask windows depending on the desired pattern and/or its intended use.

The present invention also broadly relates to a method for forming a pattern on a substrate including the steps of producing an energetic neutral atom and/or molecular beam from a source. The produced beam is then directed on to a patterning assembly including a substrate, a beam sensitive film and a mask, where the mask includes beam opaque regions, zones or areas, and beam transparent windows and the beam sensitive film is disposed on the surface of the substrate. Forming a pattern in the sensitive film due to the interaction of the film material with the neutral particle beam constituents, where the resulting pattern can either be a positive pattern of the mask windows or a negative pattern of the mask windows depending on the desired pattern and/or its intended use. Finally, developing the pattern by removing either the beam exposed regions or the beam unexposed regions to form a patterned substrate. The method can also include depositing a material over the pattern and removing portion of the material to form electronic elements on the substrate. Of course, the patterning and removing steps can be repeated and the removing steps can be by traditional etching and depositing techniques as is well known in the art.

The neutral constituents of the neutral particle beam can be any neutral atom or molecule having a mass greater than 1 amu; however, as the size of the atom or molecule increase, there is generally an increase in blurring processes increasing minimum feature size. Preferred atoms and molecules include hydrogen (H) atoms, deuterium (D) atoms, helium (He) atoms, lithium (Li) atoms, beryllium (Be) atoms, boron (B) atoms, hydrogen gas ($H_2$), trihydrogen gas ($H_3$), LiH, LiD, or similar atomic or molecular species.

The apparatuses and methods of this present invention can be used to make a variety of different sub-micron devices including the following:

| Element Type | Element size range | Preferred element size range |
|---|---|---|
| Sterilization Filters | ≧50 nm | ≧30 nm |
| Liquid Filters | variable (depends on application) | variable (depends on application) |
| Light Filters[a] | ≧80 nm (IR); 40 nm (visible); ≧15 nm(UV) | |
| Integrated Circuits | ≧50 nm | ≧30 nm |
| Molecular Electronics | ≧10 nm | ≧ 5 nm |
| Nanomagnetic Devices | ≧50 nm | ≧25 nm |

[a]Metal mesh filters, which can be designed to block a frequency or range of frequencies or pass a frequency or range of frequency.

The term element type refers not only to the device, but also to the size of the elements that make up the device. Thus, the a filter, the elements can be pores, channels, or grooves or the like having a cross-section of ≧50 nm, preferably ≧30 nm. For electronic devices, the elements can be transmission lines, capacitors, resistors, transistors, or any component having capacitance, resistance, impedance, inductance, or mixtures or combinations thereof. The table is a guide to describe the type of structures and their relative size that can be produced using the apparatus and method of this invention. Of course, the apparatus and method of this invention can be used to make any size structure or element above the smallest element achievable by this method. Thus, filters can be made with pores as large as desired to pores having a cross-section of ≧20 nm.

Referring now to FIG. 1, a preferred embodiment of an arrangement for patterning a substrate is shown to include a source member 1 that emits a beam 2 of energetic neutral particles that traverses an evacuated drift-tube 3 and impinges on a mask member 4 perforated by transmission windows 5. The energetic neutral particles that pass through the transmission windows 5 form an image 6 of the mask pattern on a reproduction member 7.

Figure 2:
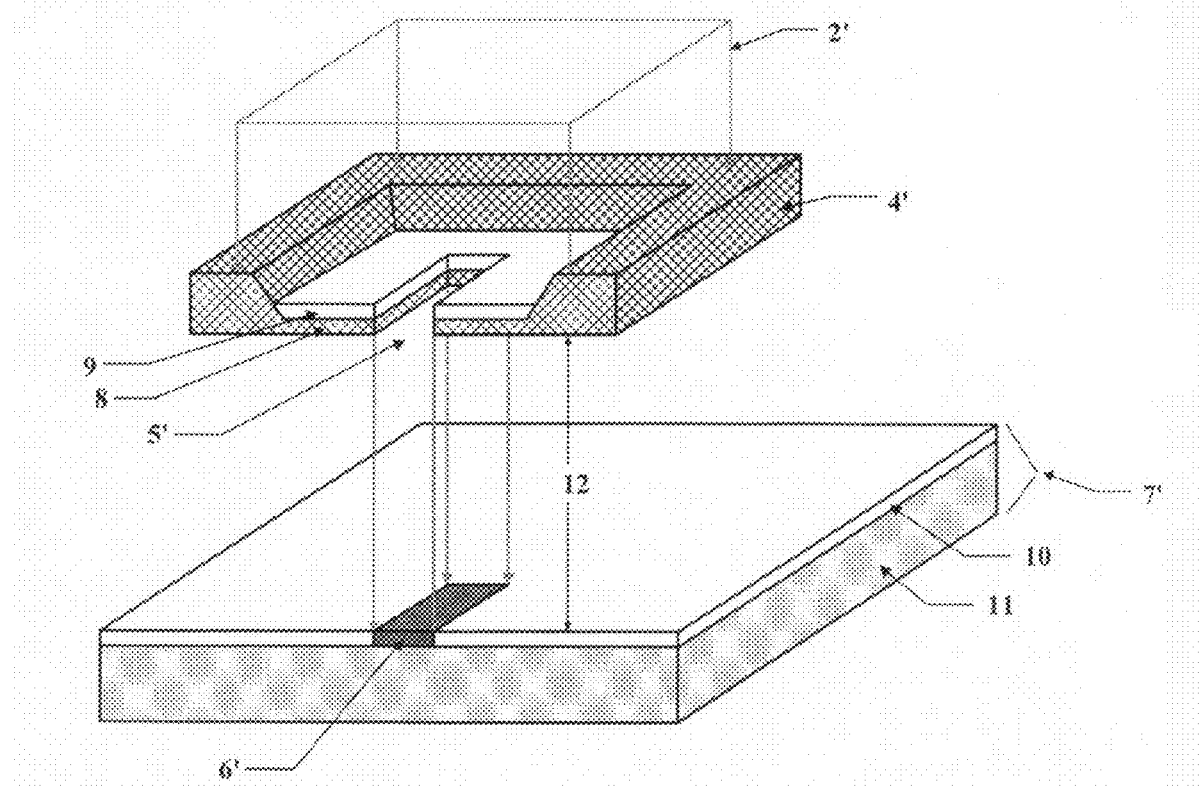
FIG. 2 depicts an enlarged view of the mask member and substrate member of FIG. 1.

Referring now to FIG. 2, an enlarged view of mask member 4' is shown having a support membrane 8 coated with an energetic neutral particle absorbing film 9 and a reproduction member 7' comprising an energetic neutral particle-sensitive layer 10 supported by the substrate 11. The sensitive layer 10 is disposed between the substrate 11 and the mask 4' for absorbing energetic neutral particles in accordance with the image 6' generated by the mask 4' when illuminated by an energetic neutral particle beam 2'. A gap 12 is maintained between the mask member 4' and the reproduction member 7' so that the mask member 4' and the reproduction member 7' do not contact at any time.

Figure 3:
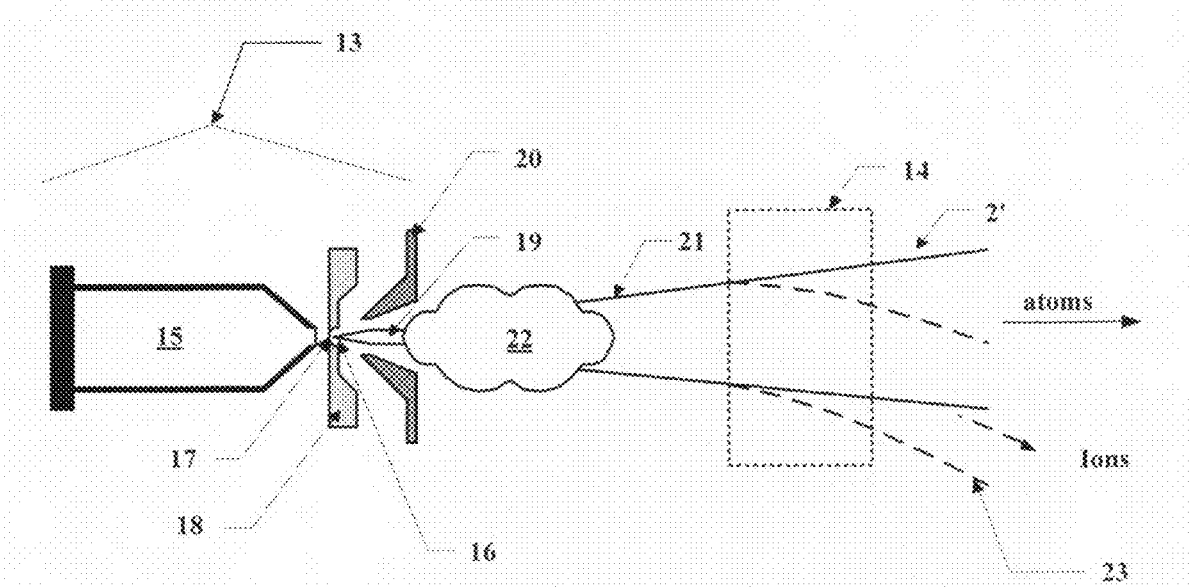
FIG. 3 depicts an enlarged view of the energetic neutral particle source of FIG. 1.

One preferred embodiment of the source member 1 is a duoplasmatron ion source 13 and a deflector 14 arrangements as shown in FIG. 3. The duoplasmatron ion source 13 comprises a discharge chamber 15 connected to an expansion cup 16 by an aperture 17 in an anode 18. When the discharge chamber 15 is filled with a source gas and a discharge ignited, a beam 19 of positive ions can be extracted from the expansion cup 16 by a suitable negative voltage applied to an extraction electrode 20. A fraction of the ion beam 19 is neutralized by charge transfer collisions with the source gas effusing from the discharge chamber 15 through the anode aperture 17 and expansion cup 16, thus producing a mixed beam 21 of energetic ions 23 and neutral particles. This neutralization process takes place in a neutralization region 22 just beyond the extraction electrode 20. A magnetic or electrostatic deflector 14 then removes the ions 23 from the mixed beam 21 thereby producing a pure beam 2' of energetic neutral particles.

When a duoplasmatron ion source 13 is operated with a He source gas at a pressure of about 150 mTorr, a discharge power of about 1 kW and an extraction electrode 20 voltage of about −30 kV, about 10% of the He$^+$ ion beam 19 is neutralized, producing a beam 2' of energetic neutral He atoms with total flux of about $6.0*10^{11}$ atoms/sec having a kinetic energy of about 30 keV. When the length of drift tube 3 is 10 M, the energetic He atom beam 2' is uniform over a substrate 11 area of 400 cm$^2$ and an exposure time for a poly(methylmethacrylate) energetic neutral particle sensitive layer 10 is about 8 minutes. Thus, the rate of substrate exposure of the preferred embodiment is 0.8 cm$^2$/sec.

The support membrane 8 may be a single crystal silicon, a polyimide, a titanium or other material which forms a taught membrane with thickness between about 0.3 micrometers and about 5.0 micrometers. The transmission windows 5' in support membrane 8 are typically formed by electron beam direct-write lithography and reactive ion etching. The energetic neutral particle absorbing film 10 is required to prevent energetic neutral particle damage to the support membrane 5' and may be comprised of vitrified carbon (see U.S. Pat. No. 6,063,246, incorporated herein by reference) or gold.

Energetic neutral particle absorbing films are required to maintain constant stress for energetic neutral particle exposure doses exceeding $10^{20}$/cm$^2$. Stress should also be constant for atmospheric exposures exceeding 1 year. The energetic neutral particle sensitive layer 10 may be poly(methylmethacrylate), AZ1350J and many other common resist materials and the substrate 11 may be glass, silicon or any other smooth material. The gap 12 between the reproduction member 7' and the mask member 4' is typically between about 10 micrometers and about 1 centimeter, although larger or smaller gaps may be appropriate in some applications.

The blur due to diffraction of energetic neutral particles by the mask member 4' is a factor in arranging the gap 12 between the mask member 4' and the reproduction member 7'. The blur δ in the printed image due to diffraction is related to the quantum-mechanical wavelength λ and width g of the gap 12 by the relation:

$$\delta = \sqrt{\lambda \cdot g}$$

Since the wavelength of 20 keV He atoms is 0.0001 nm, the resulting diffractive blur is 1.0 nm, when g is 10 micrometers. The diffractive blur for 20 keV He$^+$ ions would be the same, but the diffractive blur of 1 keV electrons and 1 nm wavelength x-rays, commonly used in practice, would be 20 nm and 100 nm, respectively. The diffractive blur could be reduced to 1 nm for electrons and x-rays by reducing the width of the gap to 26 and 0.1 nm, respectively. These values are impractically small. An important advantage of energetic neutral particle lithography, vis-à-vis electrons and x-rays is the large gap 12 that is permitted between the mask member 4' and the reproduction member 7'.

Figure 4:
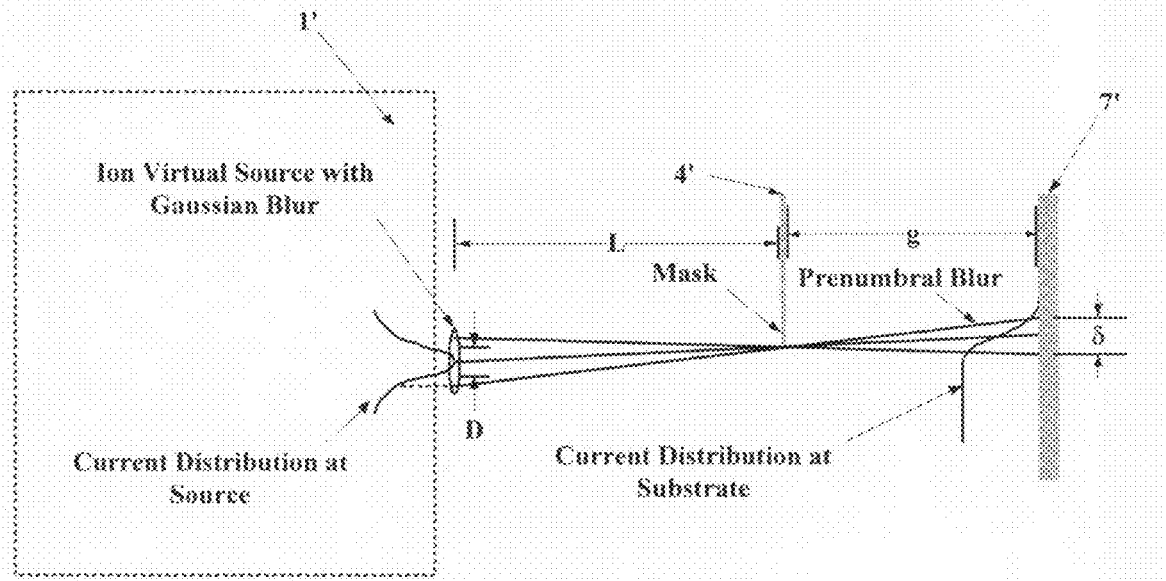
FIG. 4 illustrates the role of finite source size to penumbral blur.

The blur due to penumbra as illustrated in FIG. 4, is also a factor in arranging the gap 12 between the mask member 4 and the reproduction member 7. If D is the diameter of the apparent emitting area (the virtual source size) of energetic neutral particle source 1', L is the length of drift-tube 3, and g is the width of gap 12 between mask member 4' and reproduction member 7', the width δ of the penumbral blur is given by the following equation:

$$\delta = D \cdot \frac{g}{L}$$

Figure 5:
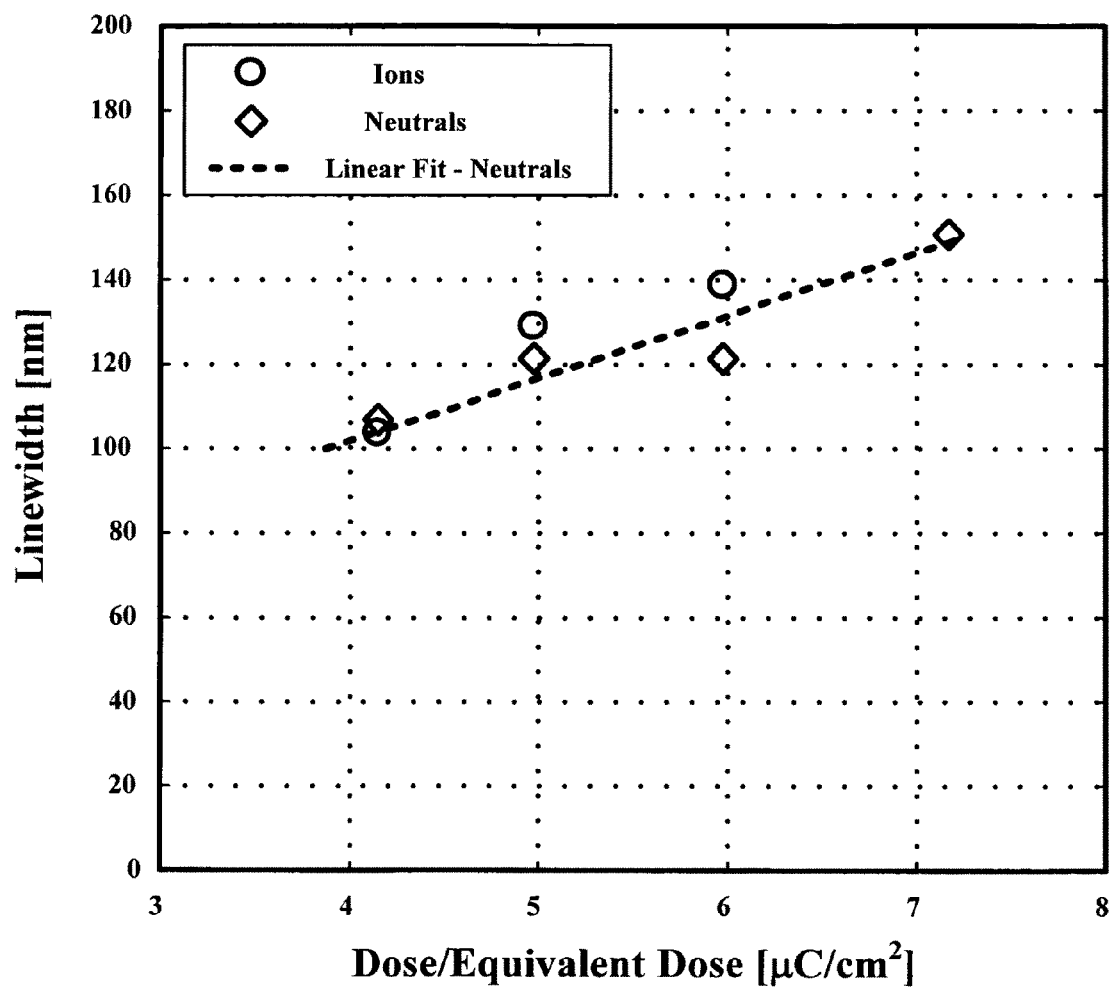
FIG. 5 depicts a graph of linewidth versus dose for 30 keV $He^+$ ion and He atom exposures.

Referring now to FIG. 5, a linewidth versus dose for 30 keV helium ions (circles) and atoms (diamonds) are shown. For these exposures, the linewidth in the mask was 90 nm and the proximity gap was 620 mm. The increase in linewidth as dose increases is due to lithographic blur. The Gaussian blur extracted from this data is 53 nm (full-width-half-maximum) for both ions and atoms. Since diffractive blur is only 8 nm in this case, most of the measured blur is penumbral in origin-due to the finite size of the source. We conclude that the source size of ions and neutral particles is the same. This is a very important result, showing that the virtual source size of an ion source is not necessarily degraded by the scattering process that generates energetic neutral particles. Quantitatively, the penumbra of ions and atoms is about 0.085 nm per micron of gap. Thus, penumbral blur is less than 1 nm for a 10 µm proximity gap.

Figure 6A:
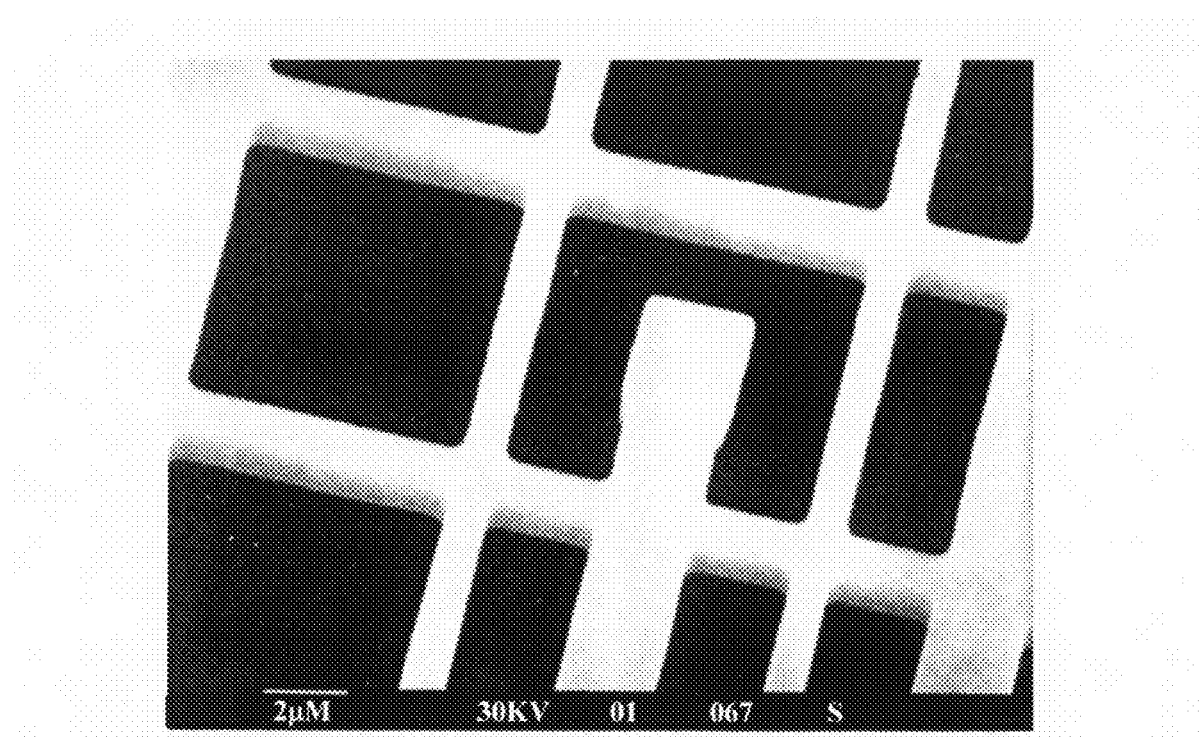
FIG. 6 depicts a mask (A) and copies printed in the preferred embodiment of the energetic neutral particle lithographic system FIG. 1 with a mixed beam of energetic $He^+$ ions and He atoms (B) and energetic neutral He atoms alone (C)
Figure 6B:
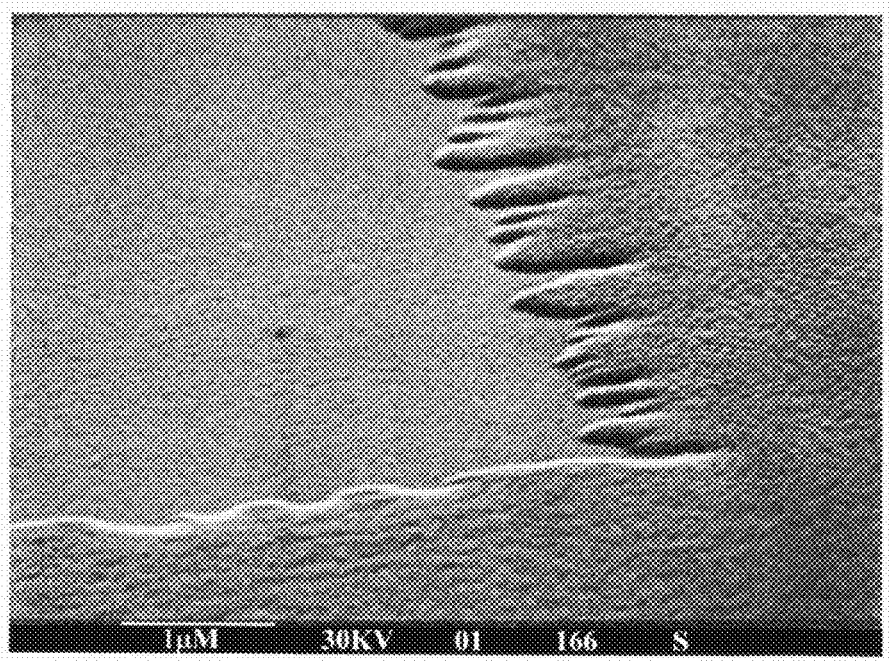
Figure 6C:
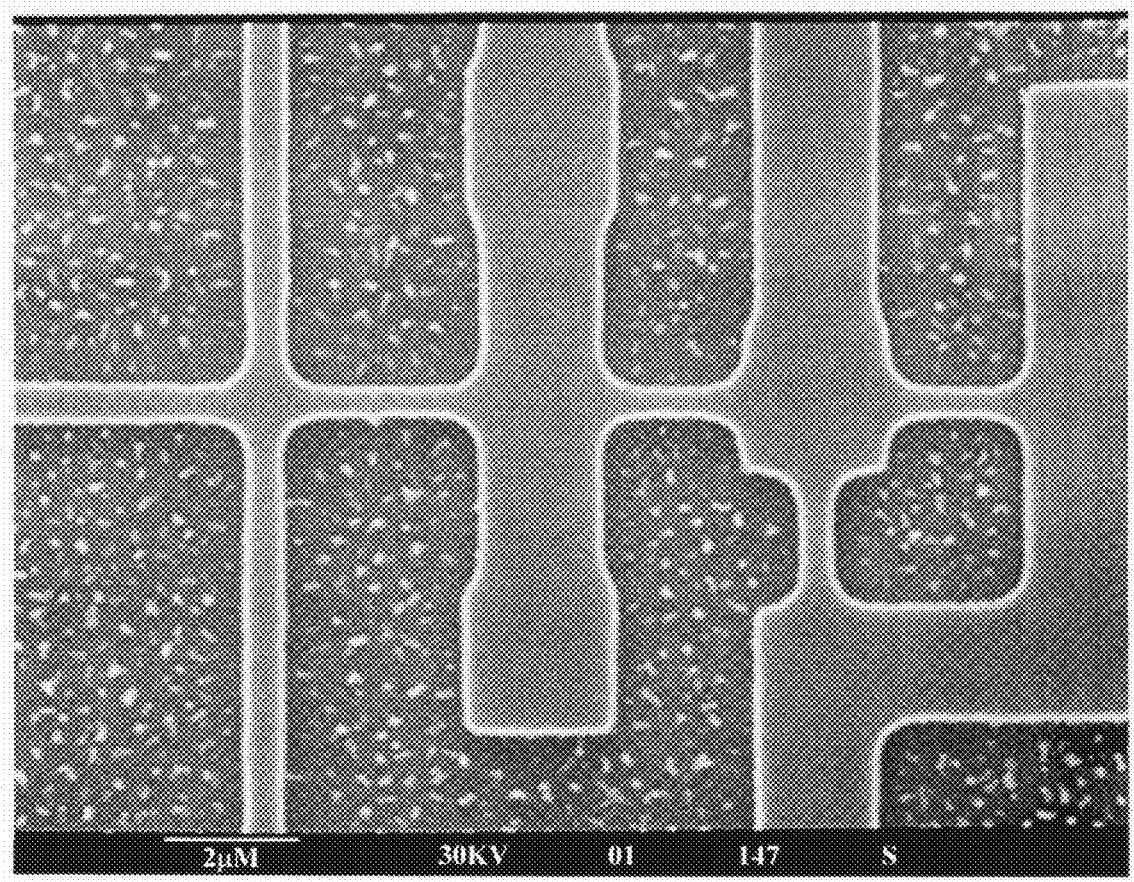

An important advantage of using energetic neutral particles, instead of ions, is their immunity to Coulomb scattering by fixed and mobile electrostatic charges on or in the mask or substrate. The immunity of energetic neutral particles to substrate charging is illustrated in FIG. 6, where a mask A was printed in the preferred embodiment of the invention as set forth in FIG. 1 using both the mixed beam 21 of energetic He$^{30}$ ions and energetic He atoms, a magnetic deflector 14 being disabled, and with the energetic He atom beam 2' alone, with the deflector 14 being activated with a magnetic field of 1.5 kGauss over the 10 cm length of the pole of a magnetic deflector 14. The substrate 11 was not electrically conducting and thus became charged by the primary ions and secondary electron emissions in the mixed beam exposure and by secondary electron emissions alone in the energetic neutral He exposure. These charges deflected the ions in the mixed beam resulting in the distorted image B while energetic neutral He atoms were not deflected resulting in the exceptional copy of the mask shown in image C.

Another important advantage of using energetic neutral particles, instead of ions, is their immunity to scattering by magnetic moments on the substrate, as for example in the case of magnetic recording media.

Figure 7A:
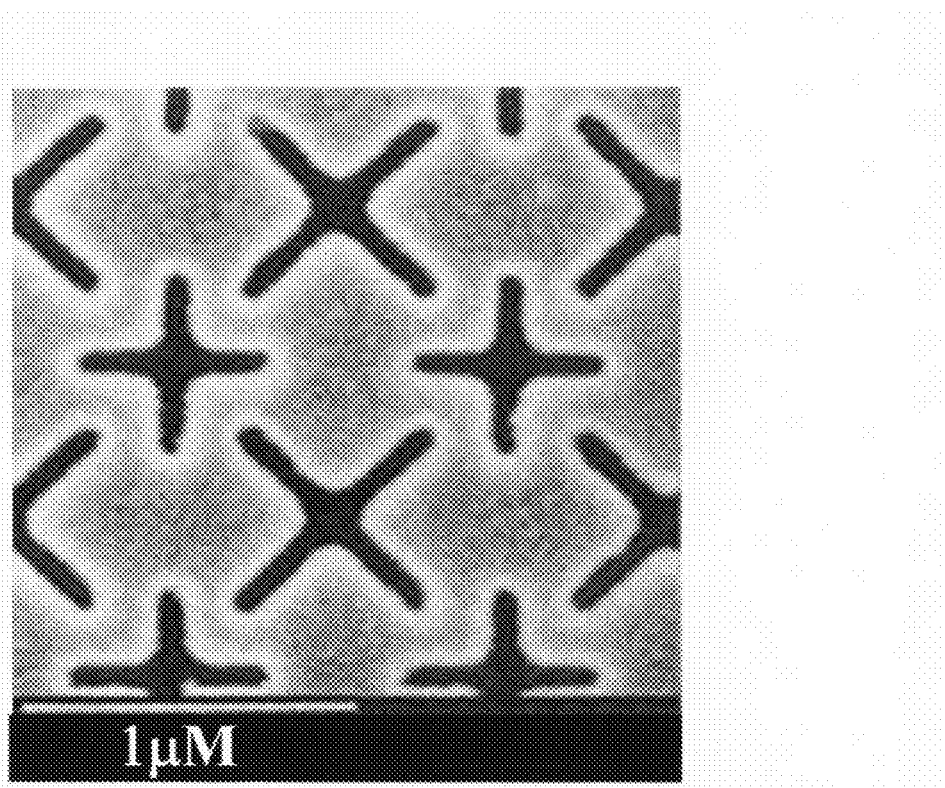
FIG. 7 depicts a field of 80 nm wide crosses, in a silicon mask (a) and in an ion image (b) printed with a 0.6 mm mask-to-wafer gap.
Figure 7B:
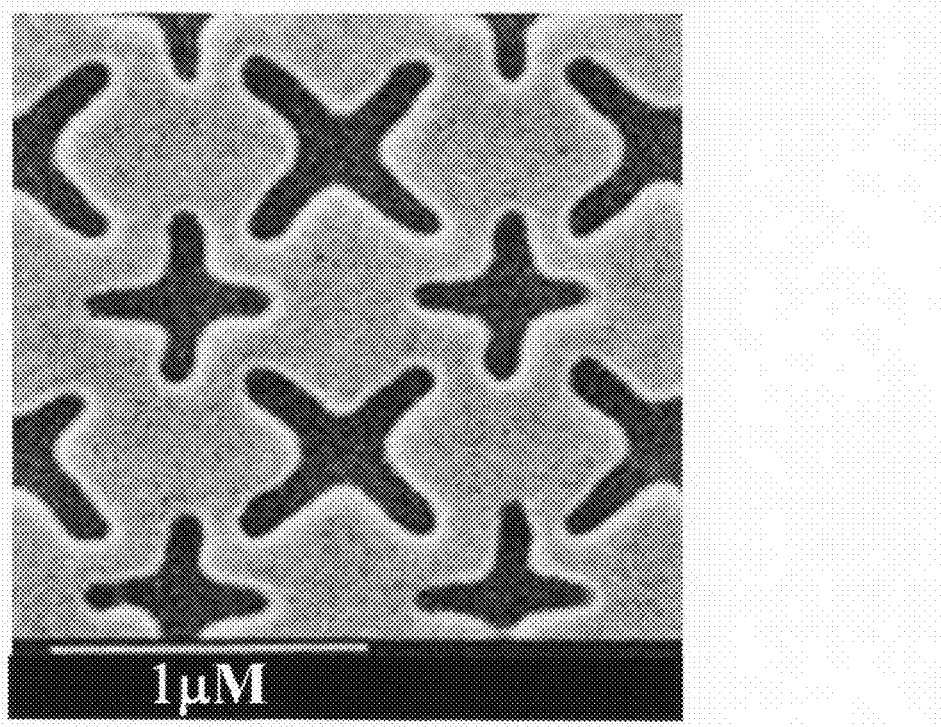

Referring now to FIG. 7, a field of crosses, 80 nm wide, in a silicon mask (a) and an ion image (b) printed with a 0.6 millimeter mask-to-wafer gap is shown. Mask charging artifacts are seen most clearly when the mask-to-wafer gap is large or feature sizes are small. The distortion of the image is caused by deflections of the lithography ions within the mask openings. This distortion is entirely absent when printing with energetic neutral particles instead of ions. Thus, the energetic neutral particle lithographic system produces much more exact replicas of the mask than is possible with mixed beams or with ion beams.

Figure 8:
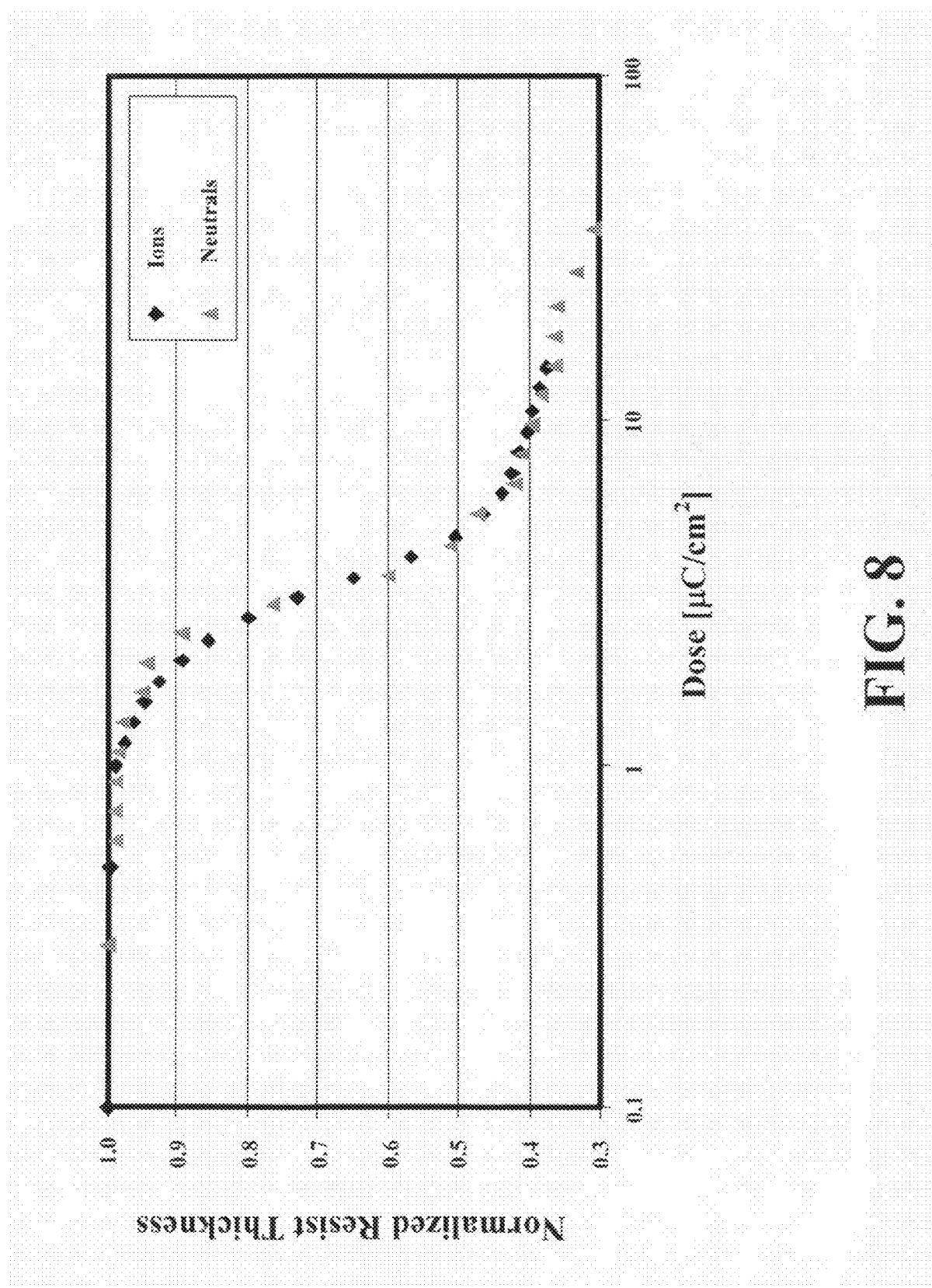
FIG. 8 depicts a graph of the fraction of resist remaining as a function of dose for 30 keV $He^+$ ions (diamonds)and He atoms (triangles). The atom dose has been scaled so that the curves coincide at 3.5 $\mu C/cm^2$.

Referring now to FIG. 8, the fraction of poly(methylmethacrylate) resist that remains after exposure and development as a function of dose for 30 keV He$^+$ ions and He atoms is compared. The atom dose has been scaled so that the curves coincide for a single ion dose near 3.5 µC/cm$^2$. From the close match of the data, we conclude that the interaction of energetic ions and the corresponding energetic neutral particles with the resist is very similar, suggesting little difference in scattering cross-sections or rates of energy loss between ions and neutrals. Thus, the blur due to the scattering of energetic neutral particles as they pass through resist should be very similar to the case of ions.

Figure 9:
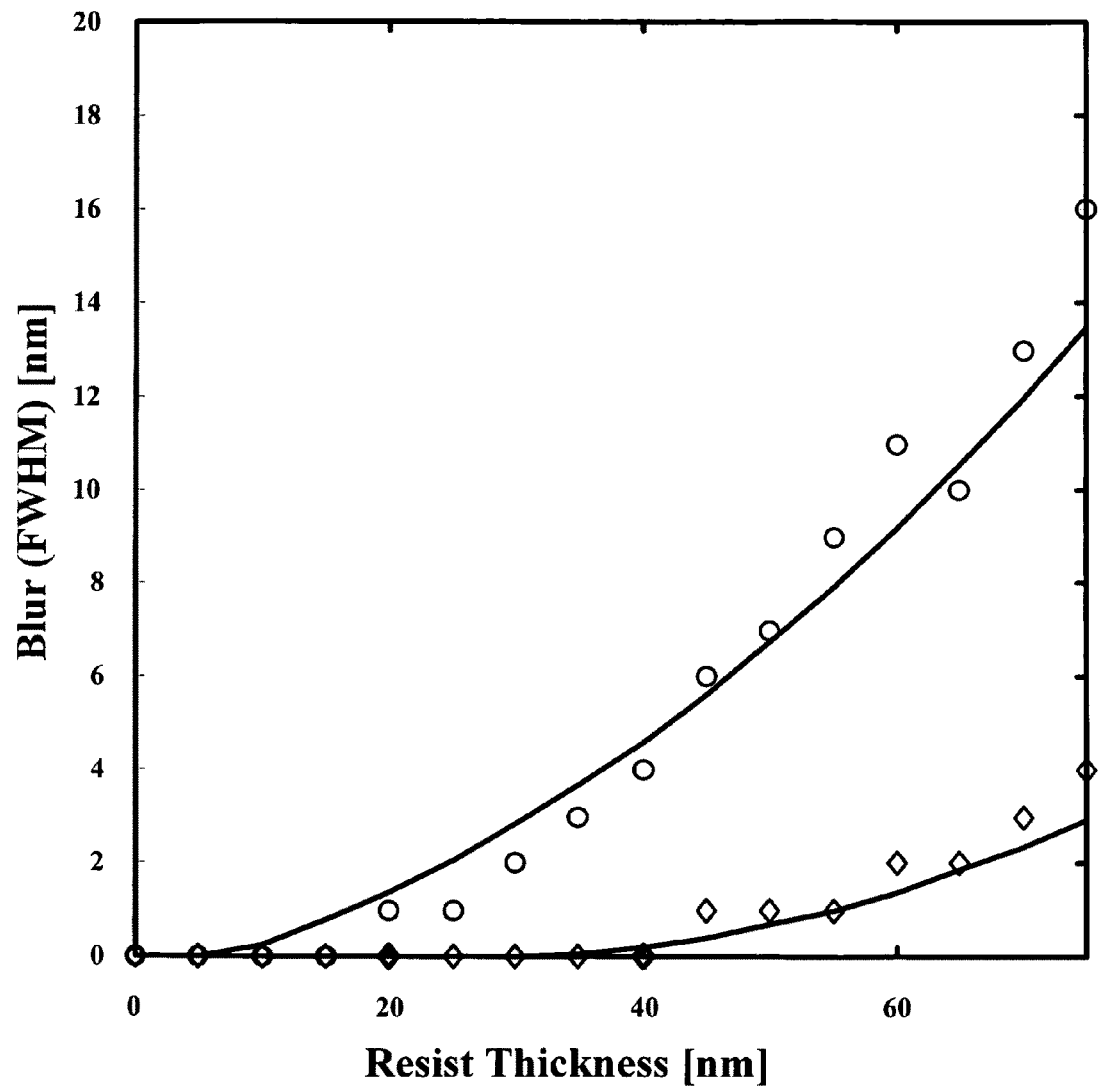
FIG. 9 depicts a graph of the blur due to resist scattering as a function of resist thickness for 10 keV $He^+$ and $H^+$ ion exposures.

Referring now to FIG. 9, the lithographic blur due to scattering of 10 keV $H^+$ and $He^+$ ions as a function of resist thickness is shown. The blur for energetic $He^+$ ions is less than 1 nm in 30 nm thick resist. For $H^+$ ions the blur is less than 1 nm for even 50 nm thick resist. Thus, the blur of He and H energetic neutral particles due to scattering in resist can both be less than 1 nm for appropriately scaled resist thickness. However, H has far less blur due to resist scattering than does He. Equivalently, resists can be thicker, with the same blur, for energetic H neutral particle lithography than for energetic He neutral particle lithography.

We have seen above that the lithographic blur of the preferred embodiment of the energetic neutral particle lithographic apparatus due to diffraction, penumbra and resist scattering can each be less than 1 nm for a practical throughput of 0.8 $cm^2$/sec. Moreover, there is, in principle, no blur or distortion due to Coulomb scattering by charges in or on the mask or in or on the substrate. Thus, an advantage of energetic neutral particle lithography is a combined lithographic blur in the 2 nm range coupled with practical throughput. This implies that for the many applications where linewidth is greater than 10 nm, linewidth will be constant within 15-20% over the entire dose range above about 2 times the critical dose where the patterns first begin to appear. This exposure latitude for such fine features has never before been possible. In manufacturing lithography, such linewidth generally varies by a factor of 2 over a comparable range of doses. This feature is of great practical importance for users of the technology; dose control is technically simple, pattern bias is less than 20% for features of all sizes thus simplifying mask design, and it is possible to use a large overexposure factor to compensate for the effects of shot-noise, the statistical variation of dose. Elementary statistical considerations suggest that overexposure factors of 4 or more may be desirable when printing 10 nm features.

Figure 10:
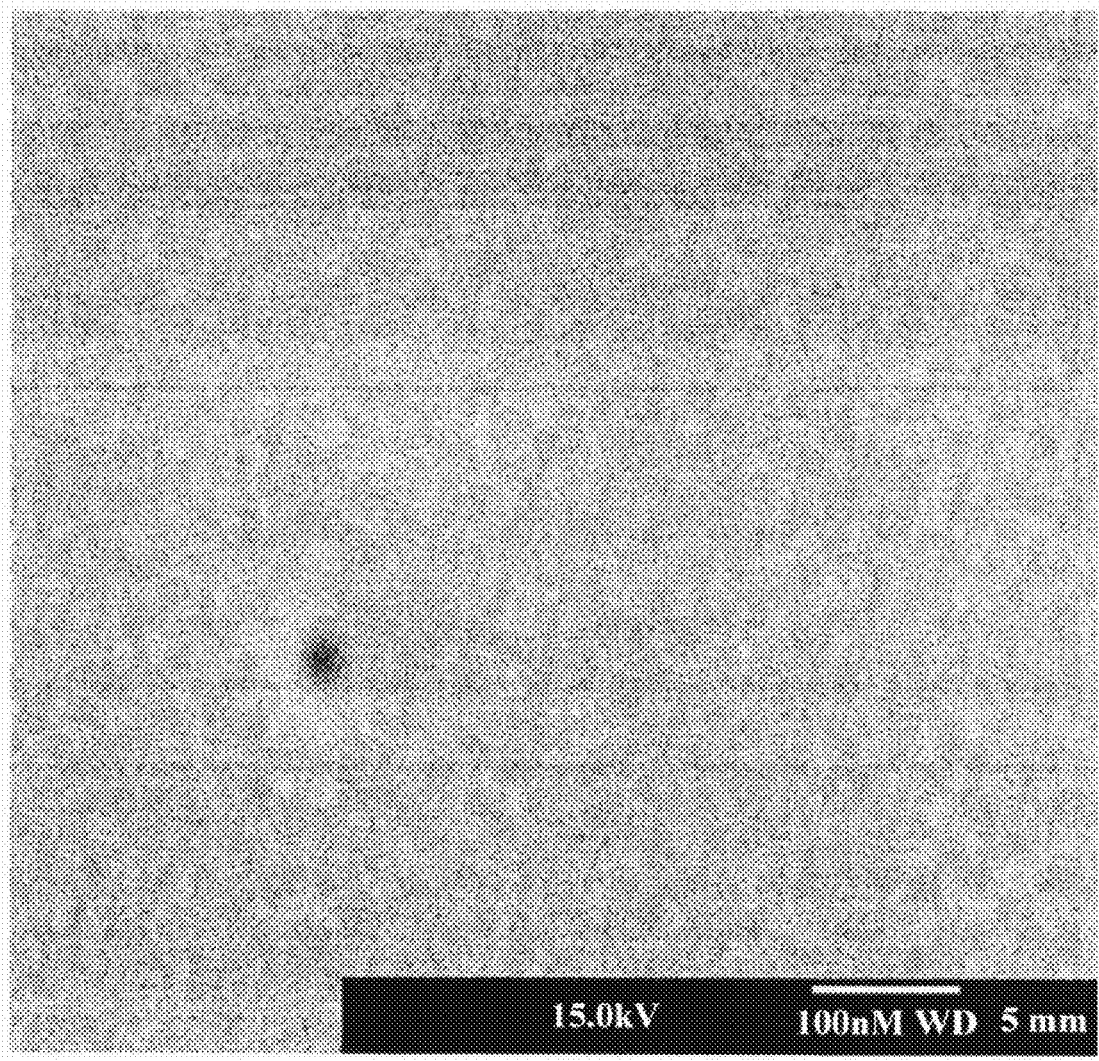
FIG. 10 depicts a scanning electron micrograph of a 20 nm feature formed in poly(methylmethacrylate) resist by energetic neutral particle lithography with 30 keV He atoms.
Figure 11:
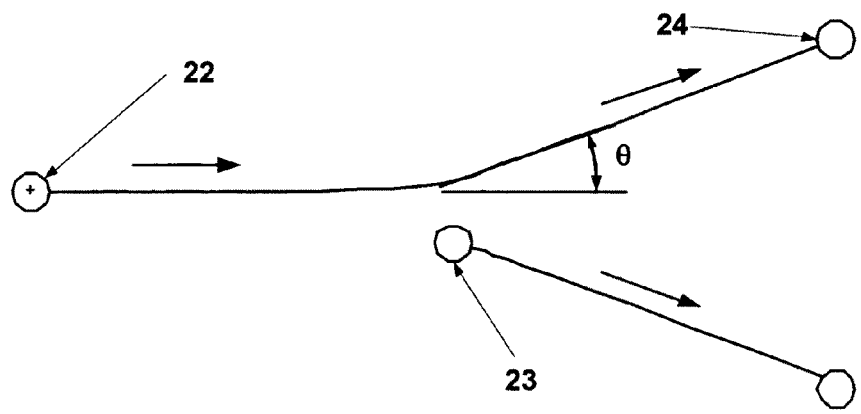
FIG. 11 depicts a diagram showing the process of creating an energetic particle by charge transfer scattering between an energetic ion and a gaseous atom or molecule.

Referring to FIG. 10, a micrograph of a 20 nm round dot exposed in poly(methylmethacrylate) illustrates this capability Referring now to FIG. 11, the scattering of an energetic ionized projectile 22 from a stationary target atom or molecule 23 is shown which results in a deflected projectile 24 moving in a final direction making an angle θ with respect to the initial direction the energetic ionized projectile 22. It is possible for the deflected projectile 24 to a) retain its initial charge or b) to be neutralized by the transfer of an electron to or from the target 23. These two possibilities are referred to as direct scattering and charge transfer scattering, respectively. In the case of the preferred embodiment shown in FIG. 3, the energetic ionized projectile 22 is a $He^+$ ion and the target atom 23 is a gaseous He atom.

Figure 12:
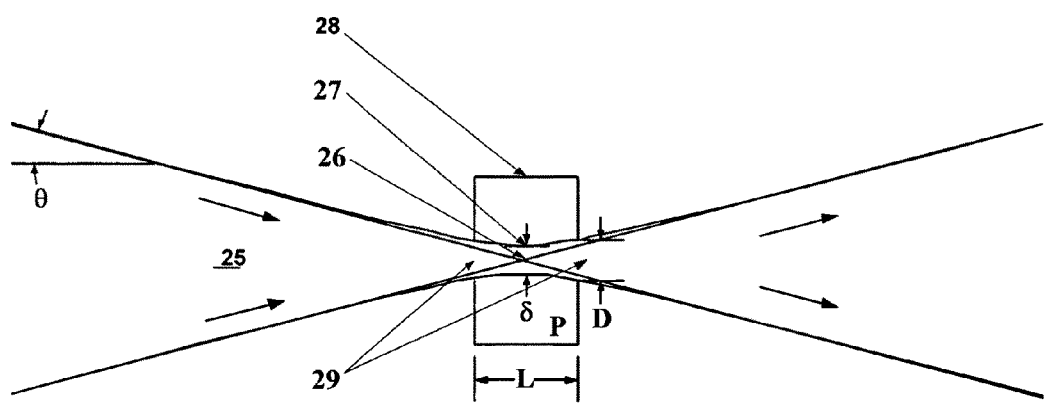
FIG. 12 depicts a graph of the cross-section for scattering in a solid cone of given half-angle for change transfer (crosses) and direct (diamonds) scattering of 1.5 keV $He^+$ ions from He atoms.

The source member 1 for the energetic neutral particle lithographic device of FIG. 1 may also be accomplished by the arrangement shown in FIG. 12, which arrangement comprises a convergent energetic ion beam 25 converging at a cross-over 26 with convergence semi-angle θ and minimum beam waist 27 of diameter δ passing through a charge transfer cell 28 of length L with entrance and exit apertures 29 of diameter D. The charge transfer cell contains a gas of pressure P for the purpose of neutralizing a fraction of energetic ion beam 25 by charge transfer scattering. The pressure P controls the number of target atoms within the cell. The gas pressure outside of the charge transfer cell 28 is preferably much less than pressure P so that negligible charge transfer scattering takes place outside the cell. The means of producing a convergent energetic ion beam 25 and a charge transfer cell 28 are well-known to those skilled in the art. The diameter D of the apertures should be such that the ion beam does not strike the apertures.

The brightness β of the convergent energetic ion beam 25 with total current I at cross-over 26 is given by $\beta = I/(\pi\theta\,\delta)^2$. When the pressure P in the cell is adjusted so that each energetic ion undergoes at most one charge transfer scattering event, the corresponding brightness β' of the energetic neutral particle portion of the beam leaving the cell is $\beta' = \beta\, nL\sigma(\theta)$ where n is the density of target particles inside the cell and σ(θ) is the cross-section for charge exchange scattering into a solid cone of angle θ.

Figure 13:
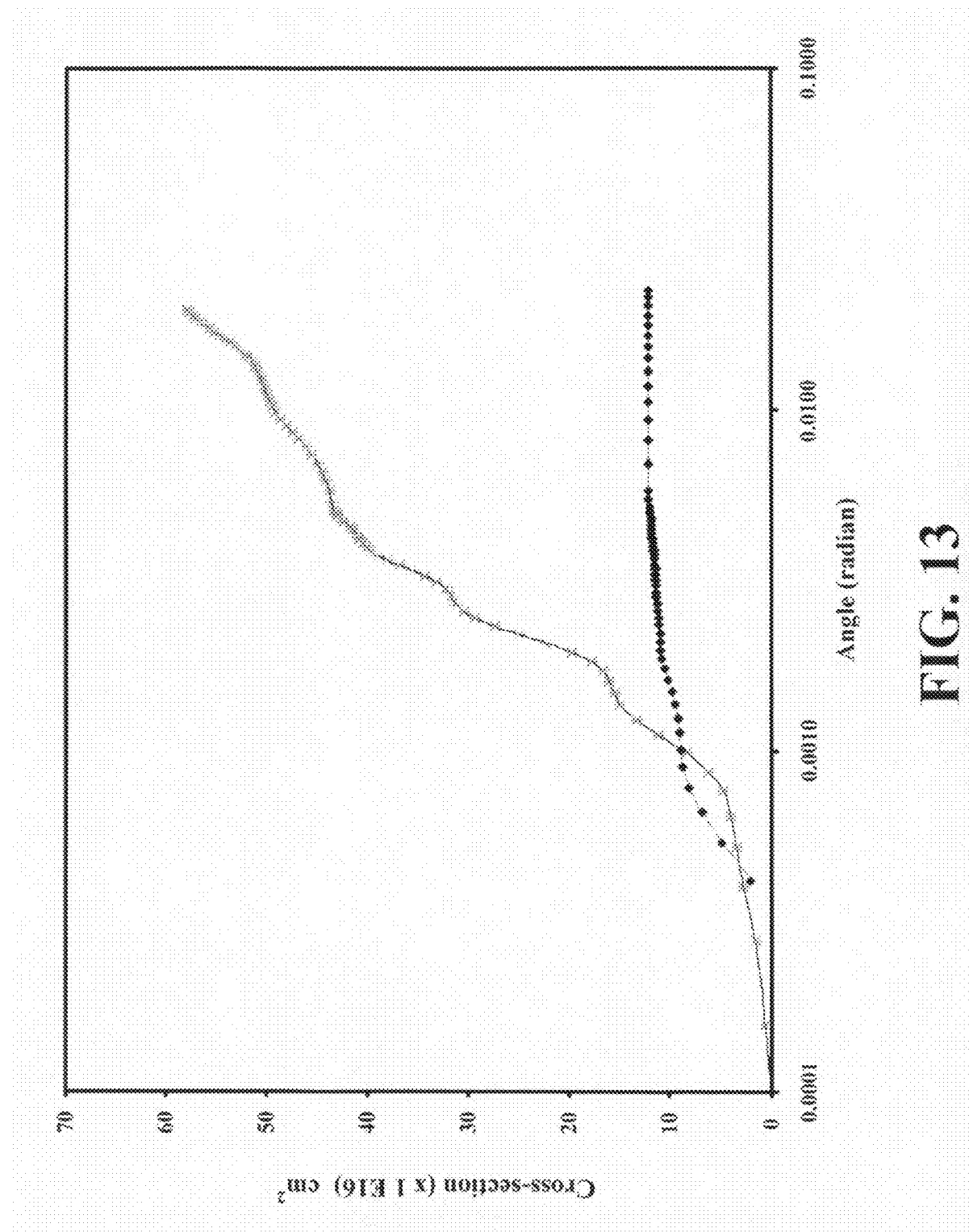
FIG. 13 depicts a diagram of another embodiment of an energetic neutral particle source of FIG. 1.

Referring now to FIG. 13, cross-sections for charge exchange and direct scattering of 1.5 keV $He^+$ ions from He target gas is shown. It is important to note that the probability of direct scattering is about five times lower than for charge exchange scattering into a cone with a 10 mradian half-angle. Hence, direct scattering of the convergent ion beam is far less important than charge transfer scattering. For a beam convergence angle θ=0.01 radians, a crossover radius ρ=25 micrometers, a discharge cell length L=1 mm and diameter D=50 micrometers and internal pressure P=0.05 mTorr, the brightness β' of the energetic neutral particle beam is about 0.50β. Thus, we have disclosed an energetic neutral particle source whose brightness is about ½ of that of the parent ion source.

Figure 14:
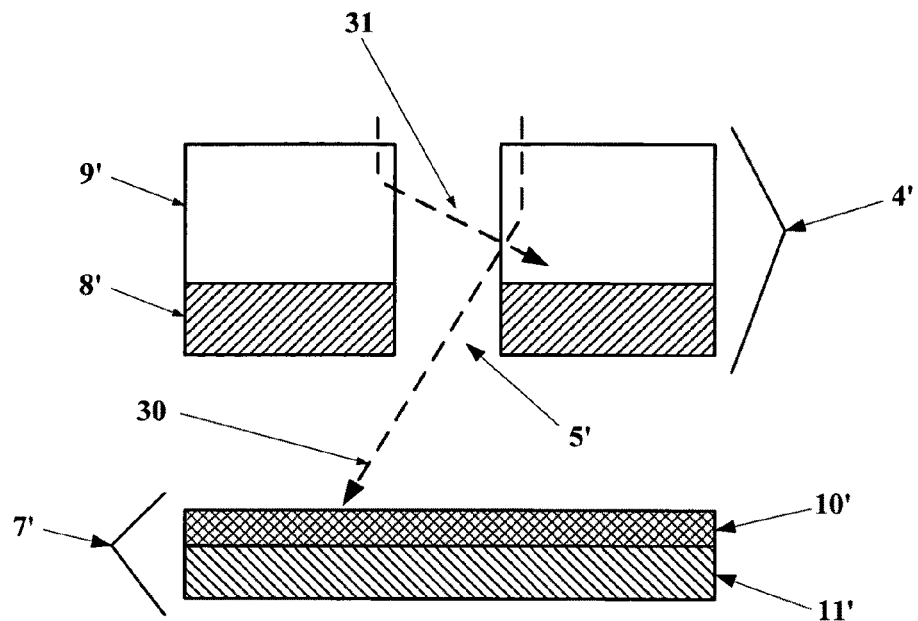
FIG. 14 depicts a diagram of energetic neutral particle scattering in a mask.

In the practice of proximity lithography, the interaction between the mask and the exposing radiation may lead to unwanted exposure of those portions of the substrate beneath the opaque regions of the mask. In energetic neutral particle lithography, this occurs because, as shown in FIG. 14, scattered particles 30 that strike the ion absorbing film 9' of mask member 4' are scattered into the transmission windows 5' and expose portions of the energetic particle sensitive film 10' on the substrate 11' of the reproduction member 7'. Reabsorbed scattered particles 31 consisting of scattered particles that have been reabsorbed in the sidewalls of the transmission windows do not contribute to the unwanted exposure of the substrate. The fraction of reabsorbed scattered particles maybe increased by increasing the aspect ratio (the ratio of mask thickness to feature size) of the transmission windows. As aspect ratio increases, however, it becomes more difficult to repair defects where etching of transmission windows is incomplete or inadvertent etching of the opaque regions occurs. In addition, the defect probability increases with increasing aspect ratio.

Figure 15:
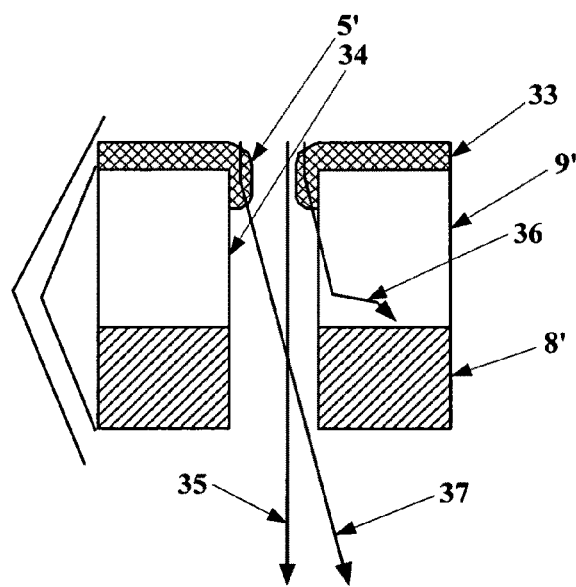
FIG. 15 depicts a diagram of a composite scattering mask.

Referring now to FIG. 15, a composite scattering mask comprising a substrate mask 32 and a thin scattering layer 33 is shown and addresses this issue. A partially conformal coating process such as sputtering, evaporation onto a rotating substrate, or chemical vapor deposition is used to deposit the scattering layer so that the size of the transmission windows 5' of the composite scattering mask is smaller than the transmission windows 34 in the substrate mask. In this way, many repairs require only modifications, additions or subtractions, to the thin scattering layer. Moreover, repairs to the substrate mask are facilitated by its larger dimensions, hence smaller aspect ratio than would be the case with a conventional mask, as shown FIG. 2, of the same dimensions.

Generally, the scattering layer will not be thick enough to absorb the ions. Instead, scattering and reabsorbtion of energetic neutral particles, as shown in FIG. 14 and discussed above, create the mask image 6' on the reproduction means 7'. When the energetic neutral particle beam 2 illuminates a mask, unscattered particles 37 pass through the windows 5' and contribute to the energetic neutral particle image 6' on the reproduction member 7'. Reabsorbed scattered particles 36, consisting of particles that have been scattered in the scattering layer 33 and reabsorbed within the scatter layer 33 or the substrate mask 32, do not contribute to the energetic particle image 6' on the reproduction member 7'. Scattered, but not reabsorbed, particles 37, on the other hand, do contribute to said unwanted exposure. The contribution of scattered, but not reabsorbed, particles 37 to said image can be reduced, as discussed above.

Figure 16A:
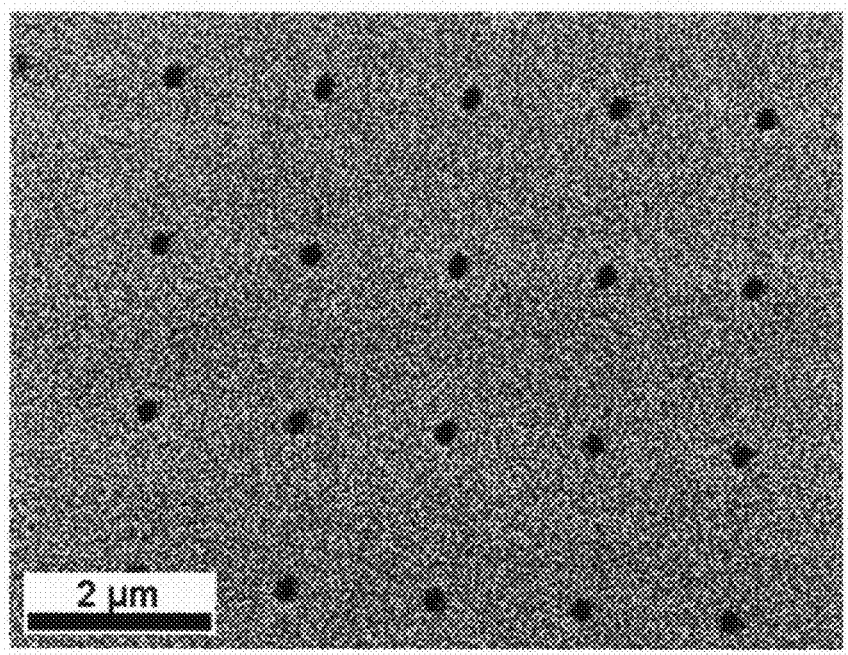
FIG. 16 depicts a micrograph showing (left) a substrate mask with circular transmission windows 220 nm in diameter and (right) a composite scattering mask with transmission windows reduced to a diameter of 100 nm by the application of a gold scattering layer.
Figure 16B:
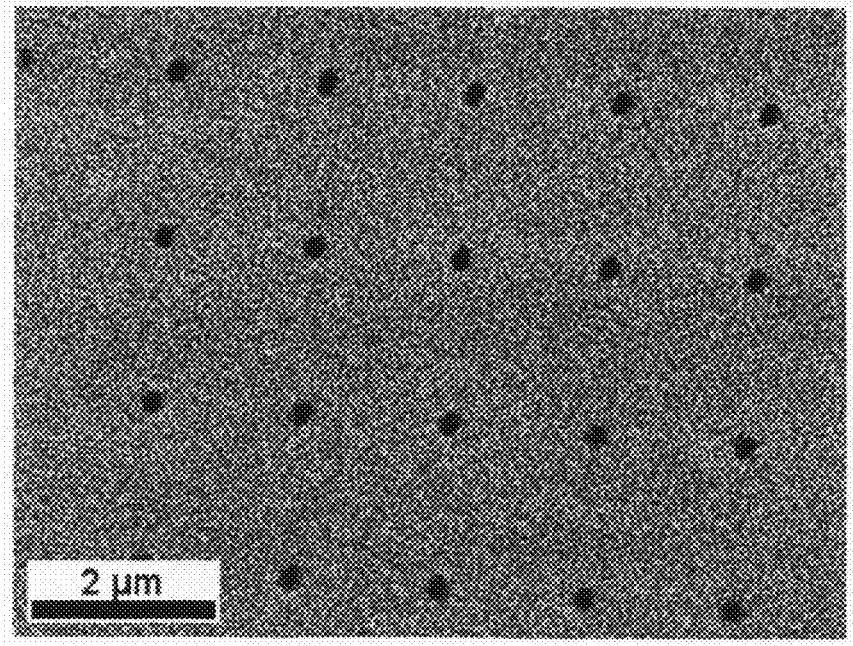
Figure 17:
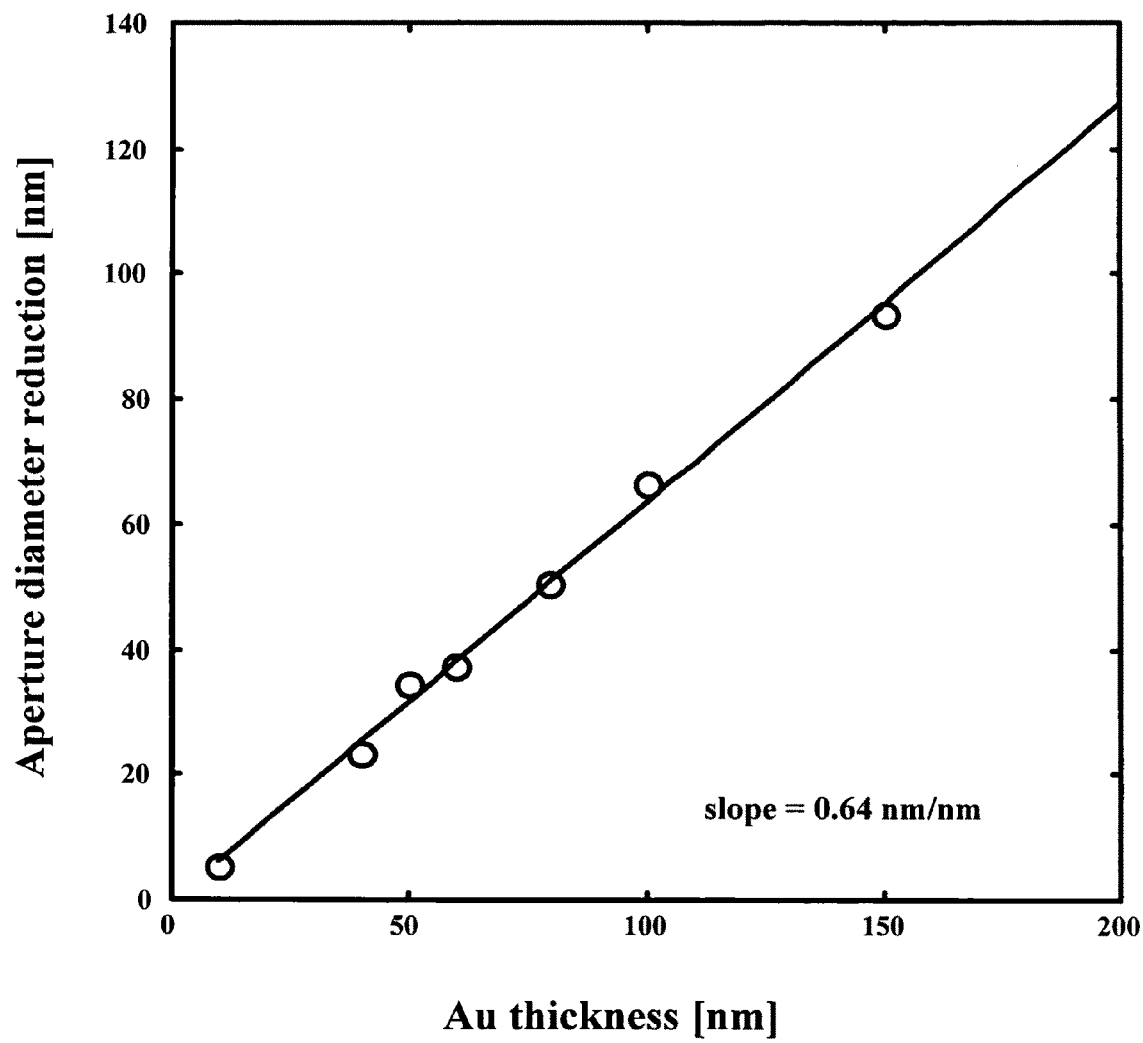
FIG. 17 depicts a graph of the reduction in diameter of circular transmission windows, initially 220 nm in diameter as a function of sputtered gold thickness.

Referring now to FIG. 16, a micrograph is shown that compares a substrate mask having 220 nm round transmission windows with a corresponding scattering mask having 100 nm round windows. FIG. 17 shows the reduction in the diameter of a round aperture, initially 220 nm in diameter, as a function of the thickness of a gold scattering layer deposited by sputtering. The 20 nm feature shown in FIG. 10 was printed with such a scattering mask.

Figure 18:
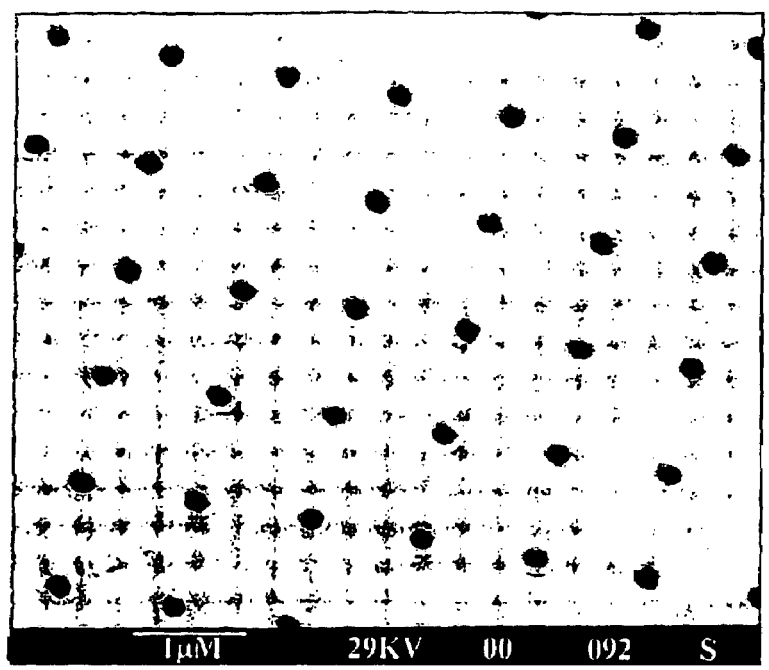
FIG. 18 depicts a micrograph of a water filter consisting of an array of 100 nm pores in a polyimide membrane fabricate by energetic neutral particle lithography.
Figure 19:
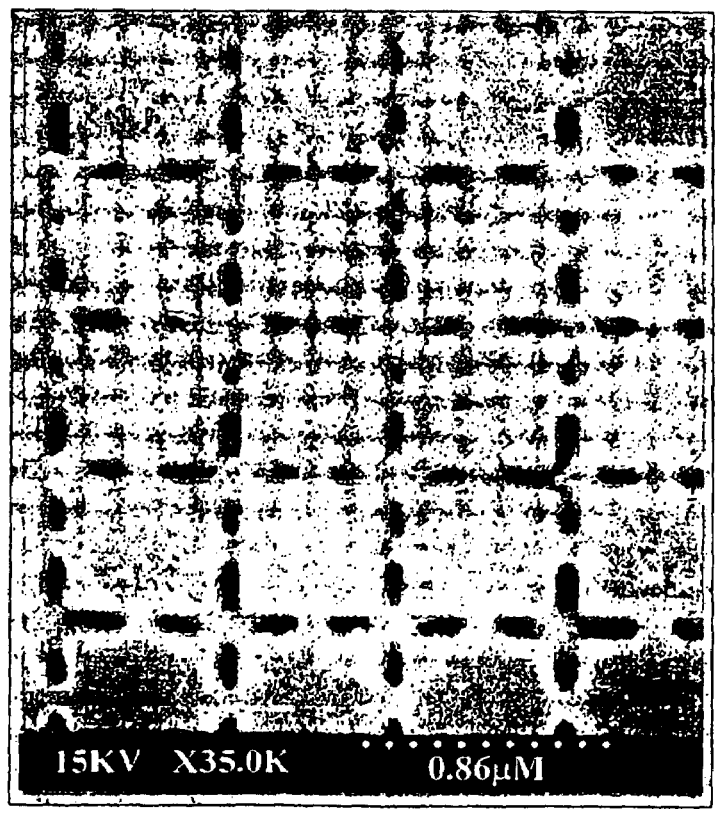
FIG. 19 depicts an infrared metal-mesh band-pass filter fabricated by energetic neutral particle lithography.

Energetic neutral particle lithography is particularly useful for fabricating nanostructures on insulating substrates, as discussed above. Two examples are shown in FIGS. 18 and 19. Looking at FIG. 18, a water filter with 100 nm pore size fabricated in an insulating polyimide membrane is shown. Looking at FIG. 19, a metal mesh, infrared bandpass filter fabricated on an insulating quartz substrate is shown.

The ultra-high resolution capability of the energetic neutral particle lithography process of this invention make it particularly attractive for nanoelectronics such as quantum dots and molecular devices, nanopatterned magnetic storage media, and nanomagnetic active devices including magnetic random accessed memory (MRAM).

All references cited herein are incorporated by reference. While this invention has been described fully and completely, it should be understood that, within the scope of the appended claims, the invention may be practiced otherwise than as specifically described. Although the invention has been disclosed with reference to its preferred embodiments, from reading this description those of skill in the art may appreciate changes and modification that may be made which do not depart from the scope and spirit of the invention as described above and claimed hereafter.

We claim:

1. An energetic neutral particle lithographic apparatus capable of replicating patterns having linewidths≧20 nm comprising:
    a source member comprising a duoplasmatron ion source producing a mixed beam of energetic ions and neutral particles and an electrostatic or magnetic deflector designed to remove the ions from the mixed beam to form a pure beam of energetic neutral particles and adapted to produce a beam of energetic neutral particles comprising atoms and/or molecules, where the atoms and/or molecules have an energy greater than about 5 keV and a mass greater than or equal to 1 amu, where the source member;
    a mask member including transmission windows in a supporting membrane and an energetic neutral particle absorbing layer thereon; and
    a reproduction member including a substrate and an energetic neutral particle sensitive film supported by a substrate, where the film is designed to absorb energetic neutral particles and form a negative or positive pattern corresponding to the mask.

2. The apparatus in claim 1, wherein the energetic neutral particles comprise He.

3. The apparatus in claim 1, wherein the energetic neutral particles comprise H atoms.

4. The apparatus in claim 1, wherein the energetic neutral particles comprise $H_2$ molecules.

5. The apparatus in claim 1, wherein the energetic neutral particle beam comprises $H_3$ molecules.

6. The apparatus in claim 1, wherein the support membrane is silicon carbide.

7. The apparatus in claim 1, wherein the support membrane is silicon.

8. The apparatus in claim 1, wherein the support membrane is polyimide.

9. The apparatus in claim 1, wherein the energetic neutral particle absorbing layer is gold.

10. The apparatus in claim 1, wherein the energetic neutral particle absorbing layer is vitreous carbon.

11. The apparatus in claim 1, wherein the spacing between the mask and the substrate is greater than 1000 times the minimum feature size.

12. The apparatus in claim 1, wherein the mask comprises a substrate mask consisting of transmission windows in a membrane, and a thin scattering layer of reduced feature size compared to said substrate mask.

13. The apparatus in claim 1, wherein the source member further comprises a beam of energetic ions produced by the duoplasmatron ion source and converging to a cross-over within a charge transfer cell, producing a mixed beam of energetic ions and neutral particles, and an electrostatic or magnetic deflector designed to remove the ions from the mixed beam to form a pure beam of energetic neutral particles.

14. A method for forming small features on a substrate comprising the steps of:
    forming a beam comprising neutral atom and/or molecules via a source member comprises a duoplasmatron ion source producing a mixed beam of energetic ions and neutral particles and an electrostatic or magnetic deflector designed to remove the ions from the mixed beam to form a pure beam of energetic neutral particles;
    directing the beam to impinge on a substrate assembly including:
        a mask member including transmission windows in a supporting membrane and an energetic neutral particle absorbing layer thereon; and
        a reproduction member including a substrate and an energetic neutral particle sensitive film supported by a substrate, where the film is designed to absorb energetic neutral particles and form a negative or positive pattern corresponding to the mask;
    removing either the exposed or unexposed portions of the film to form a patterned substrate.

15. The method in claim 14, wherein the source member further comprises a beam of energetic ions produced by the duoplasmatron ion source and converging to a cross-over within a charge transfer cell, producing a mixed beam of energetic ions and neutral particles, and an electrostatic or magnetic deflector designed to remove the ions from the mixed beam to form a pure beam of energetic neutral particles.

16. The method in claim 14, wherein the energetic neutral particles comprise He.

17. The method in claim 14, wherein the energetic neutral particles comprise H atoms.

18. The method in claim 14, wherein the energetic neutral particles comprise $H_2$ molecules.

19. The method in claim 14, wherein the energetic neutral particle beam comprises $H_3$ molecules.

20. The method in claim 14, wherein the support membrane is silicon carbide.

21. The method in claim 14, wherein the support membrane is silicon.

22. The method in claim 14, wherein the support membrane is polyimide.

23. The method in claim 14, wherein the energetic neutral particle absorbing layer is gold.

24. The method in claim 14, wherein the energetic neutral particle absorbing layer is vitreous carbon.

25. The method in claim 14, wherein the spacing between the mask and the substrate is greater than 1000 times the minimum feature size.

26. The method in claim 14, wherein the mask comprises a substrate mask consisting of transmission windows in a membrane, and a thin scattering layer of reduced feature size compared to said substrate mask.

* * * * *